(12) United States Patent
Fujii

(10) Patent No.: US 6,307,227 B2
(45) Date of Patent: Oct. 23, 2001

(54) SEMICONDUCTOR DEVICE AND MANUFACTURING METHOD THEREOF

(75) Inventor: Hiroki Fujii, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/765,359

(22) Filed: Jan. 22, 2001

Related U.S. Application Data

(62) Division of application No. 09/195,433, filed on Nov. 18, 1998, now Pat. No. 6,204,104.

(30) Foreign Application Priority Data

Nov. 21, 1997 (JP) ...................................... 9-321474

(51) Int. Cl.$^7$ .................... H01L 27/108; H01L 29/76; H01L 29/94; H01L 31/119; H01L 21/8249

(52) U.S. Cl. .......................... 257/306; 257/307; 257/308; 257/309; 438/234

(58) Field of Search .................................... 257/306, 309, 257/305, 53, 302, 303, 301, 532, 307, 308, 315

(56) References Cited

U.S. PATENT DOCUMENTS

| | | |
|---|---|---|
| 5,286,991 | 2/1994 | Hui et al. . |
| 5,608,248 * | 3/1997 | Ohno ................................... 257/306 |
| 5,633,181 * | 5/1997 | Hayashi ............................... 438/234 |
| 5,759,883 * | 6/1998 | Kinoshita ............................. 438/202 |
| 5,773,860 * | 6/1998 | Kijima et al. ........................ 257/303 |
| 5,864,153 * | 1/1999 | Nagel .................................. 257/296 |

FOREIGN PATENT DOCUMENTS

| | | |
|---|---|---|
| 63-150955 | 6/1988 | (JP) . |
| 64-22054 | 1/1989 | (JP) . |
| A 4-56264 | 2/1992 | (JP) . |
| H4-348563 | 12/1992 | (JP) . |
| 5-75021 | 3/1993 | (JP) . |
| A 5-75021 | 3/1993 | (JP) . |
| 6-291262 | 10/1994 | (JP) . |
| H8-97310 | 4/1996 | (JP) . |
| A 9-172100 | 6/1997 | (JP) . |
| H9-275189 | 10/1997 | (JP) . |

* cited by examiner

Primary Examiner—David Nelms
Assistant Examiner—Thao Phuong Le
(74) Attorney, Agent, or Firm—Sughrue, Mion, Zinn, Macpeak & Seas, PLLC

(57) ABSTRACT

A semiconductor device having a capacitor, a bipolar transistor and complementary MOSFETs on a semiconductor substrate, the capacitor being constituted from a first electrode 8, a second electrode 13 separated from the first electrode by an insulating film 11 and a third electrode 15 separated from the second electrode by another insulating film 14 and connected to the first electrode is manufactured; where all electrodes in the capacitor and insulating films between them are formed simultaneously with other manufacturing steps of a bipolar transistor or the MOSFETs. This manufacturing method can produce a semiconductor device such as a Bi-CMOS and the like, which is capable of large scale integration and has a capacitor with a large capacitance but occupying only a small area, with a high efficiency and a low cost.

6 Claims, 20 Drawing Sheets

THROUGH HOLE

THROUGH HOLE

SEMICONDUCTOR DEVICE AND MANUFACTURING METHOD THEREOF

This is a divisional of application Ser. No. 09/195,433 filed Nov. 18, 1998 now U.S. Pat. No. 6,204,104, the disclosure of which is incorporated herein by reference.

BACKGROUND OF THE INVENTION

1. Field of the Invention

The present invention relates to a semiconductor device having a capacitor, a bipolar transistor and complementary metal-oxide-semiconductor field effect transistors (MOSFET) and a manufacturing method thereof.

2. Description of the Prior Art

Recently, there has been a demand to add a still larger capacitance to a Bi-CMOSLSI in which complementary metal-oxide-semiconductors (CMOS) marked by large scale integration and low power consumption, as well as a bipolar transistor marked by rapid performance, are formed upon a single semiconductor substrate.

In Japanese Patent Application Laid-open No. 22054/1989, there is disclosed a manufacturing method of a capacitor in a semiconductor device having a MOSFET and a bipolar transistor on a single substrate. In this method, one electrode of the capacitor is formed simultaneously with a gate electrode of the MOSFET, and, after insulating films of the capacitor are formed, an opposite electrode of the capacitor is formed simultaneously with an emitter electrode of the bipolar transistor. The device herein has a structure in which capacitor insulating films are sandwiched by the overlying and underlying electrodes of the capacitor.

However, the capacitor formed in this method occupies a large area, which restricts a large scale integration of the LSI.

Further, in Japanese Patent Application Laid-open No. 291262/1994, there is disclosed a method of adding a capacitor with high precision to a Bi-CMOS, wherein a lower electrode of the capacitor is formed over an insulating film and concurrently serves as polysilicon to form gate electrodes of MOSs, while an opposite electrode of the capacitor serves as polysilicon to form a base or an emitter. Nevertheless, this method also has a problem that the capacitor occupies a rather large area.

Meanwhile, as a method of providing a large capacitance without requiring a large area for that, there is, for example, disclosed in Japanese Patent Application Laid-open No. 150955/1988. In this method, as shown in FIG. 19(a), a polysilicon layer 53 is placed as an intermediate layer. Sandwiching a silicon dioxide film 51, this polysilicon layer 53 and a diffusion region 52 which is set in an epitaxial layer 57 lying over a silicon substrate 56 form a first capacitor. The polysilicon layer 53 and an Al film 54, sandwiching a silicon dioxide film 58, form a second capacitor. The diffusion region 52 and the Al film 54 are connected with each other by means of a contact made through the silicon dioxide film. Accordingly, as shown in FIG. 19(b), two capacitors are connected in parallel between an Al film 55 brought from the polysilicon layer 53 and the Al film 54 so that a larger capacitance value can be attained.

However, the silicon dioxide film 58 is a part called as an interlayer insulating film and its film thickness is substantial, which causes a problem that a sufficiently large capacitance cannot be necessarily obtained. Moreover, a resistance of the polysilicon layer section becomes relatively large, resulting in another problem of poor high-frequency characteristics thereof.

Further, another capacitor structure formed on a semiconductor substrate, as shown in FIG. 20(a), is disclosed in Japanese Patent Application Laid-open No. 75021/1993. In this structure, upon a p-type semiconductor substrate 100, an n-type epitaxial layer 102 is layered, and, over that, an $n^+$-diffusion layer 104 is formed. A dielectric layer 106 of silicon dioxide is then formed and a conductive layer 108 of polysilicon is layered in a region where a capacitor is to be formed. Next, a dielectric layer 110 of polysilicon is formed and, after applying a phosphorus glass (PSG) layer 112, a conductive layer 114 of aluminium is layered to connect with an electrode A. The conductive layer 114 of aluminium also connects with an $n^+$-diffusion layer through a contact hole and consequently to an electrode B. Accordingly, a capacitor C1 with the dielectric layer 106 and a capacitor C2 with the dielectric layer 110 are connected in parallel so that a capacitance thereof becomes C1+C2, as shown in FIG. 20(b).

However, the application of this structure to a Bi-CMOS was not described at all in this prior art. Therefore an efficient manufacturing method for a practical use has been kept unknown. Further, this structure gives rise to a problem of poor high-frequency characteristics since a resistance value of the polysilicon section becomes large.

SUMMARY OF THE INVENTION

In light of the above problems, an object of the present invention is to provide a method of manufacturing, with a high efficiency and a low cost, a semiconductor device such as a Bi-CMOS and the like, which is capable of large scale integration and has a capacitor with a large capacitance and occupying only a small area.

Another object of the present invention is to provide a semiconductor device, such as a Bi-CMOS and the like, which has a capacitor structure having a large capacitance and a low resistance but occupying only a small area and is capable of large scale integration and marked by a rapid response and a good high-frequency characteristics and a manufacturing method thereof.

In accordance with an aspect of the present invention, there is provided a first method of manufacturing a semiconductor device having a capacitor, a bipolar transistor and complementary MOSFETs on a semiconductor substrate, the capacitor comprising a first electrode, a second electrode separated from the first electrode by an insulating film and a third electrode separated from the second electrode by an insulating film and connected to the first electrode; which comprises the steps of:

forming the first electrode simultaneously with forming gate electrodes of the MOSFETs;

forming the insulating film between the first electrode and the second electrode simultaneously with forming an insulating film which prevents source-drain regions of the MOSFETs and a collector bring-out region of the bipolar transistor from being etched, when a base electrode is worked into shape by etching;

forming the second electrode simultaneously with forming a base electrode of the bipolar transistor;

forming the insulating film between the second electrode and the third electrode simultaneously with forming an insulating film which insulates between a base electrode and an emitter electrode of the bipolar transistor; and forming the third electrode simultaneously with forming the emitter electrode of the bipolar transistor.

In accordance with another aspect of the present invention, there is provided a second method of manufacturing a semiconductor device having a capacitor, a bipolar transistor and complementary MOSFETs on a semiconductor substrate, the capacitor comprising a first electrode, a second electrode separated from the first electrode by an insulating film, a third electrode separated from the second electrode by an insulating film and connected to the first electrode and a fourth electrode formed in the semiconductor substrate, separated the first electrode by an insulating film and connected to the second electrode; which comprises the steps of:

forming the fourth electrode simultaneously with forming a collector electrode of the bipolar transistor;

forming the first electrode simultaneously with forming gate electrodes of the MOSFETs;

forming the insulating film between the first electrode and second electrode simultaneously with forming an insulating film which prevents source-drain regions of the MOSFETs and a collector bring- out region of the bipolar transistor from being etched when a base electrode is worked into shape by etching;

forming the second electrode simultaneously with forming a base electrode of the bipolar transistor;

forming the insulating film between the second electrode and the third electrode simultaneously with forming an insulating film which insulates between a base electrode and an emitter electrode of the bipolar transistor; and forming the third electrode simultaneously with forming the emitter electrode of the bipolar transistor.

In accordance with yet another aspect of the present invention there is provided a semiconductor device having, upon a semiconductor substrate, a capacitor comprising a first electrode, a second electrode separated from the first electrode by an insulating film and a third electrode separated from the second electrode by an insulating film and connected to the first electrode; wherein the first electrode and third electrode are joined together by means of a through hole opened around the center of the second electrode and an electric contact, being formed as a ring within an interlayer insulating film overlying the capacitor, touches round the circumference of the second electrode.

In accordance with yet another aspect of the present invention, there is provided another semiconductor device having, upon a semiconductor substrate, a capacitor comprising a first electrode, a second electrode separated from the first electrode by an insulating film, a third electrode separated from the second electrode by an insulating film and connected to the first electrode and a fourth electrode formed in the semiconductor substrate, separated from the first electrode by an insulating film and connected to the second electrode; wherein the first electrode and third electrode are joined together by means of a through hole opened around the center of the second electrode; and a bring-out section of the fourth electrode to the surface of the substrate is formed as a ring;

an electric contact is formed as a ring within an interlayer insulating film overlying the capacitor; and the circumference of the second electrode, a ring of the bring-out section of the fourth electrode to the substrate surface and the ring of the electric contact touch round with one another.

BRIEF DESCRIPTION OF THE DRAWINGS

FIG. 1 is views showing an example of a capacitor section of a semiconductor device according to the present invention.

FIG. 2 is views showing another example of a capacitor section of a semiconductor device according to the present invention.

The drawings from FIG. 3 to FIG. 10 are schematic cross-sectional views illustrating steps of a first manufacturing method of the present invention.

The drawings from FIG. 11 to FIG. 18 are schematic cross-sectional views illustrating steps of a second manufacturing method of the present invention.

Figure 19A:
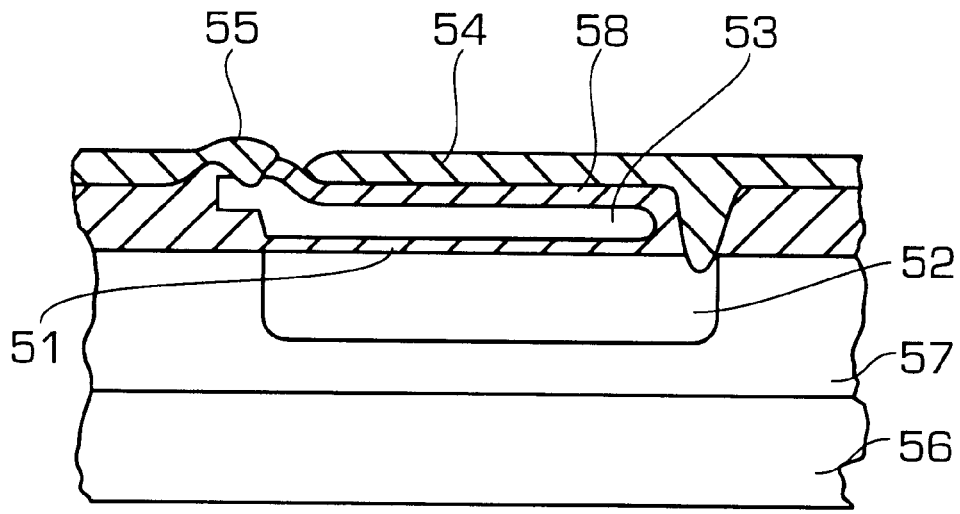
Figure 19B:
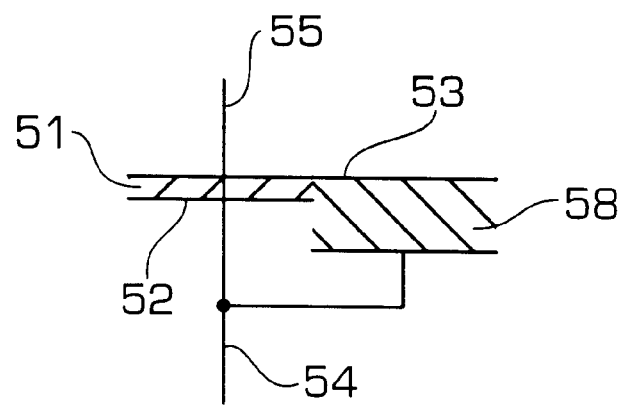

FIG. 19 is a view showing a conventional capacitor structure.

Figure 20A:
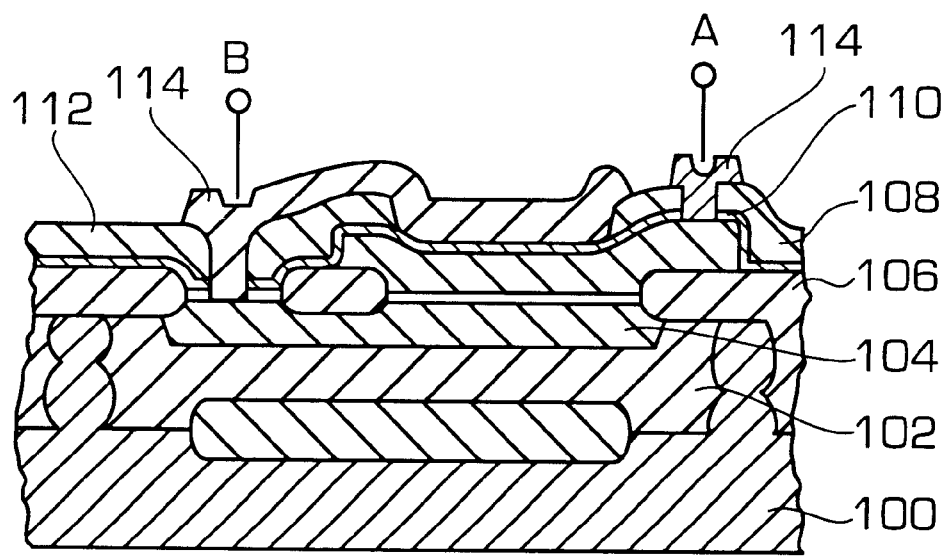
Figure 20B:
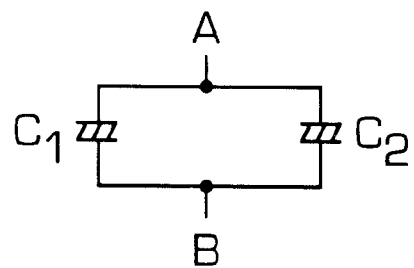

FIG. 20 is a view showing another conventional capacitor structure.

EXPLANATION OF SYMBOLS

1 . . . LOCOS oxide film
2 . . . $N^+$-buried layer
3 . . . $P^+$-buried layer
4 . . . Epitaxial layer
5 . . . P-well
6 . . . N-well
7 . . . $N^+$-collector bring-out region
8 . . . Gate polysilicon
9 . . . Gate oxide film
10 . . . Sidewall oxide film
11 . . . Silicon dioxide film
12 . . . Resist
13 . . . Base polysilicon
14 . . . Silicon nitride film
15 . . . Emitter polysilicon
16 . . . First interlayer insulating film
17 . . . Fist layer contact
18 . . . First layer wiring
19 . . . Second interlayer insulating film
20 . . . Second layer contact
21 . . . Second layer wiring
22 . . . Cover film
30 . . . Silicon substrate
32 . . . Capacitor formation region
33 . . . Bipolar formation region
34 . . . N-MOS formation region
35 . . . P-MOS formation region

DETAILED DESCRIPTION OF THE INVENTION

In the first manufacturing method of the present invention as described above, sandwiching a second electrode, a first electrode and a third electrode are formed below and above, respectively, and the first electrode and the third electrode are connected to each other. Thus, a capacitor having a large and precise capacitance and occupying only a small area can be obtained. This manufacturing method requires no extra steps since all electrodes in the capacitor and insulating films between them are formed using the same materials as those for MOSFETs or a bipolar transistor and worked into shape simultaneously.

Figure 1A:
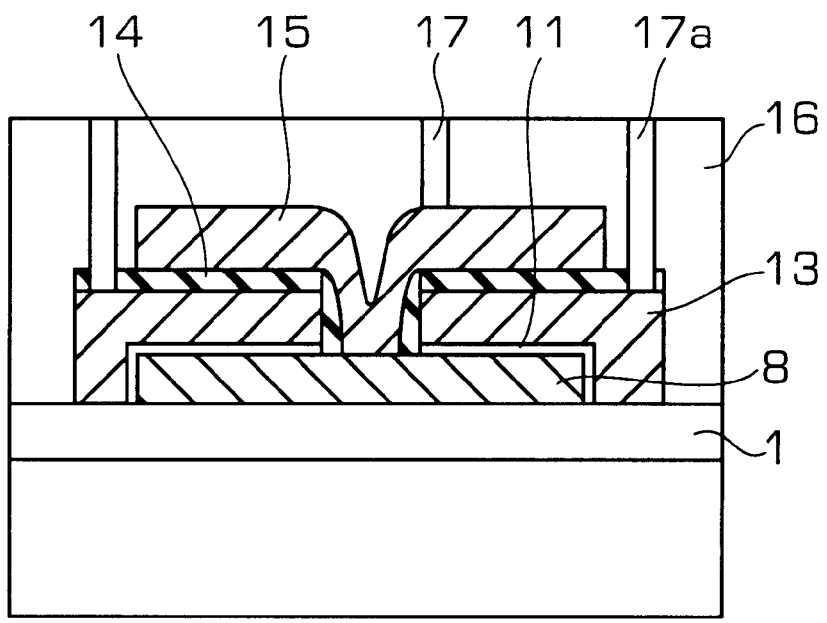
FIG. 1(a): a cross-sectional view
Figure 1B:
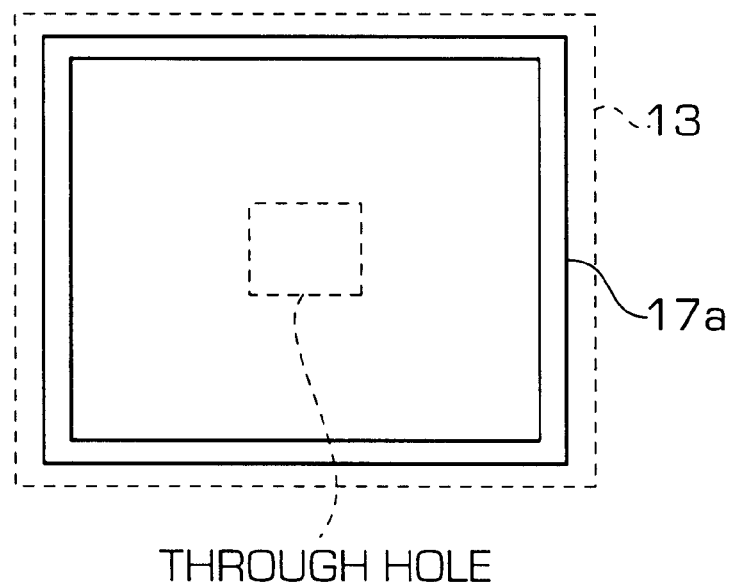
FIG. 1(b): a plan view

FIG. 1 shows an example of a capacitor section of a semiconductor device formed by the first manufacturing method. This capacitor section comprises a first electrode formed of gate polysilicon 8, a second electrode formed of base polysilicon 13, a third electrode formed of emitter polysilicon 15, as well as an insulating film formed of a silicon dioxide film 11 between the first electrode and the second electrode, and another insulating film formed of a silicon nitride film 14 between the second electrode and the third electrode.

As shown in this drawing, the first electrode and the third electrode are joined together preferably by means of a through hole opened around the center of the second electrode. Further, a contact 17a is formed within an interlayer insulating film overlying this capacitor preferably as a ring so as to touch round the circumference of the second electrode. Such a contact brought out from the second electrode in the form of a ring provides a capacitor structure with a low resistance.

Accordingly, a semiconductor device having a capacitor of such structure as a contact is brought out in the form of a ring can attain a precise and large capacitance with a small area and besides a resistance thereof is low. This semiconductor device can be preferably utilized in an integrated circuit that requires good high-frequency characteristics, for example, an voltage control oscillator (VCO), an A-D converter or the like.

The first manufacturing method described above can be easily adapted to manufacture the semiconductor device having the capacitor structure as shown in FIG. 1. That is, the first electrode and the third electrode are joined together by means of a through hole which is opened around the center of the second electrode at the same time of making an opening for formation of an emitter electrode through a base electrode in the section of a bipolar transistor. Then the electric contact is formed as a ring within an interlayer insulating film overlying this capacitor so as to touch round the circumference of the second electrode.

Further, in the second manufacturing method of the present invention as described, sandwiching a second electrode, a first electrode and a third electrode are formed below and above, respectively, and beneath this first electrode a fourth electrode is formed. The first electrode and the third electrode are connected to each other and so are the second electrode and the fourth electrode. This provides a still larger capacitance than the one the first manufacturing method provides with its capacitor structure.

This manufacturing method, as the first manufacturing method, requires no extra steps, since all electrodes in the capacitor and insulating films between them are formed using the same materials as those for MOSFETs or a bipolar transistor and worked into shape simultaneously.

Figure 2A:
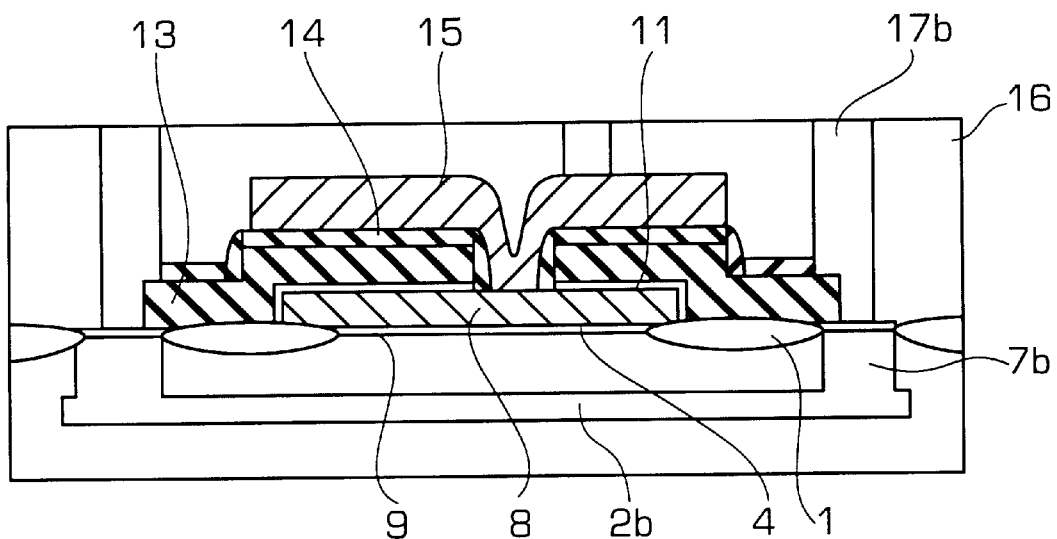
FIG. 2(a): a cross-sectional view
Figure 2B:
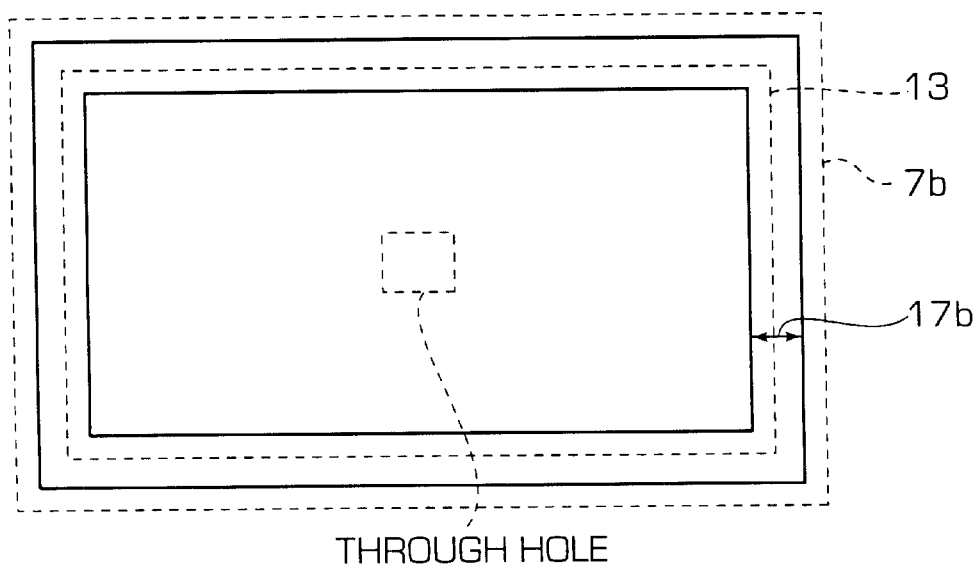
FIG. 2(b): a plan view

FIG. 2 shows an example of a capacitor section of a semiconductor device formed by the second manufacturing method. This capacitor section comprises a first electrode formed of gate polysilicon 8, a second electrode formed of base polysilicon 13, a third electrode formed of emitter polysilicon 15, as well as an insulating film formed of a silicon dioxide film 11 between the first electrode and the second electrode, and another insulating film formed of a silicon nitride film 14 between the second electrode and the third electrode. The capacitor further comprises a fourth electrode formed of an $n^+$-buried layer 2b which is separated from the first electrode by an insulating film formed of a gate oxide film 9 and this fourth electrode is electrically connected to the second electrode.

As shown in this drawing, the first electrode and the third electrode are joined together preferably by means of a through hole opened around the center of the second electrode. Further, preferably, a bring-out section 7b of the fourth electrode to the substrate surface is formed as a ring, and an electric contact 17b is formed as a ring within an interlayer insulating film 16 overlying this capacitor, in such a way that the circumference of the second electrode 13, a ring of the bring-out section 7b of the fourth electrode to the substrate surface and another ring of the electric contact 17b touch round with one another.

While the circumference of the second electrode 13, the bring-out section 7b of the fourth electrode to the substrate surface and the contact 17b in FIG. 2 all touch round with one another, one of those three may become an intermediary and be connected with two others. For example, it is sufficient that the contact 17b touches round both of the circumference of the second electrode 13 and the bring-out section 7b of the fourth electrode to the substrate surface, even if these latter two are not in touch with each other at all.

Accordingly, a semiconductor device having a capacitor of such structure as both contacts to the second electrode and to the fourth electrode are brought out in the form of a ring like this can attain a still larger capacitance with a small area, and besides a resistance thereof is low. This semiconductor device can be preferably utilized in an integrated circuit that requires a particularly large capacitance, for example, as a filter in a power source circuit, an inter-stage coupling or the like.

The second manufacturing method of the present invention can be easily adapted to manufacture a semiconductor device having this capacitor structure. That is, the first electrode and the third electrode are joined together by means of a through hole which is opened around the center of the second electrode at the same time of making an opening for formation of an emitter electrode through a base electrode in a section of a bipolar transistor. Thereafter a bring-out section of the fourth electrode to the substrate surface is formed as a ring, and an electric contact is formed as a ring within an interlayer insulating film overlying the capacitor, in such a way that the circumference of the second electrode, a ring of the bring-out section of the fourth electrode to the substrate surface and another ring of the electric contact touch round with one another.

First Embodiment

Referring to the drawings, the first manufacturing method according to the present invention is described in detail.

Figure 3:
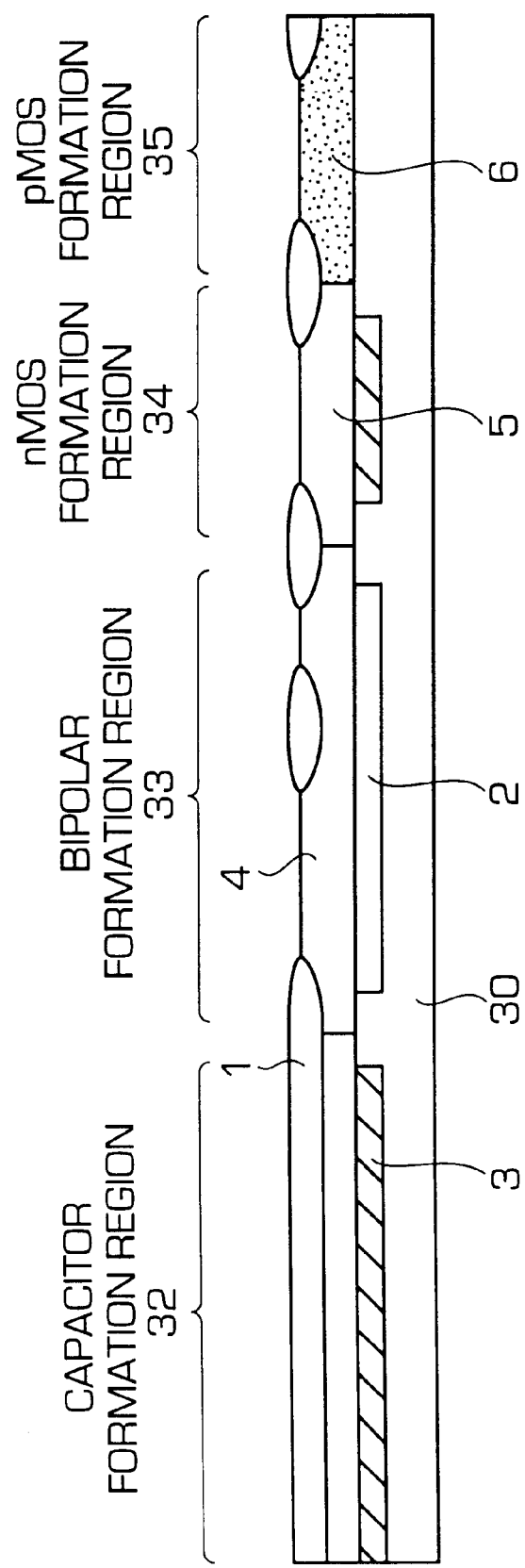

First, FIG. 3 is referred. Upon a silicon substrate 30, in a region prescribed as a bipolar formation region 33, an $n^+$-buried layer 2 serving as a collector electrode, and in regions prescribed as an n-MOS formation region 34 and a capacitor formation region 32, p+-buried layers 3 are formed, respectively. Following this, an epitaxial layer 4 with a specific resistance of 0.5~2 Ω·cm is grown on the surface to a thickness of 1~2 $\mu$m or so. Then local oxidation of silicon (LOCOS) oxide films 1 (field oxide films) which separate elements each other are formed to a thickness of 200~400 nm. At this, the LOCOS oxide film is formed so as to cover the entire surface of the capacitor formation region 32. Next, an n-well 6 is formed in a p-MOS formation region 35 and, successively, a p-well 5 is formed in the n-MOS formation region 34, and thereby the manufacturing steps up to FIG. 3 are accomplished.

The formation of an n well is carried out by means of ion implantation of phosphorus with a dose of 1~5×10$^{13}$ cm$^{-2}$ at an accelerating energy of 500~800 keV, while the formation of a p-well is carried out by means of the ion implantation of boron with a dose of 1~3×10$^{13}$ cm$^{-2}$ at an accelerating energy of 200~500 keV.

Figure 4:
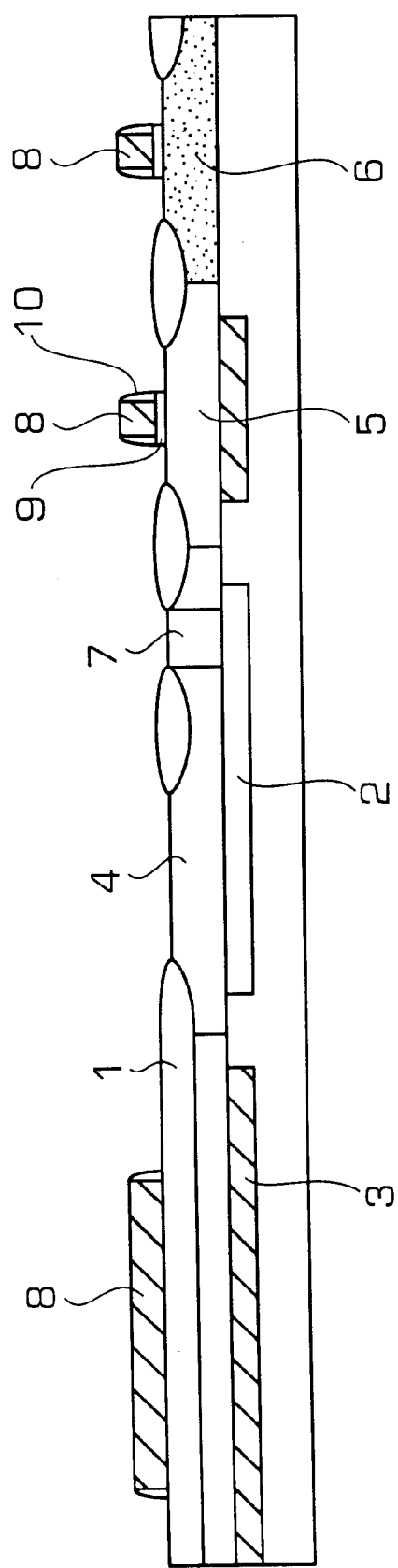

Next, FIG. 4 is referred. After a gate oxide film 9 is formed by thermal oxidation to a thickness of 5~20 nm and gate polysilicon 8 is successively deposited over the entire surface of the substrate to a thickness of 150~300 nm, they are removed by dry etching so as to leave respective gate sections of the MOSs and a section of the capacitor formation region that is to become an electrode. Next, a silicon dioxide film is deposited to the entire surface by the chemical vapour deposition (CVD) method and thereafter the etching-back is performed on the entire surface to form a sidewall oxide film 10 on the sides of the remaining polysilicon from the previous step. Next, in order to bring out the contact of the $n^+$-buried layer 2, phosphorus is injected at an accelerating energy of 50~100 keV with a dose of $1\sim5\times10^{16}$ $cm^{-2}$ and an $n^+$-collector bring-out region 7 is formed. By this step, a first electrode made of gate polysilicon 8 is formed in the capacitor formation region, as shown in FIG. 4.

Figure 5:
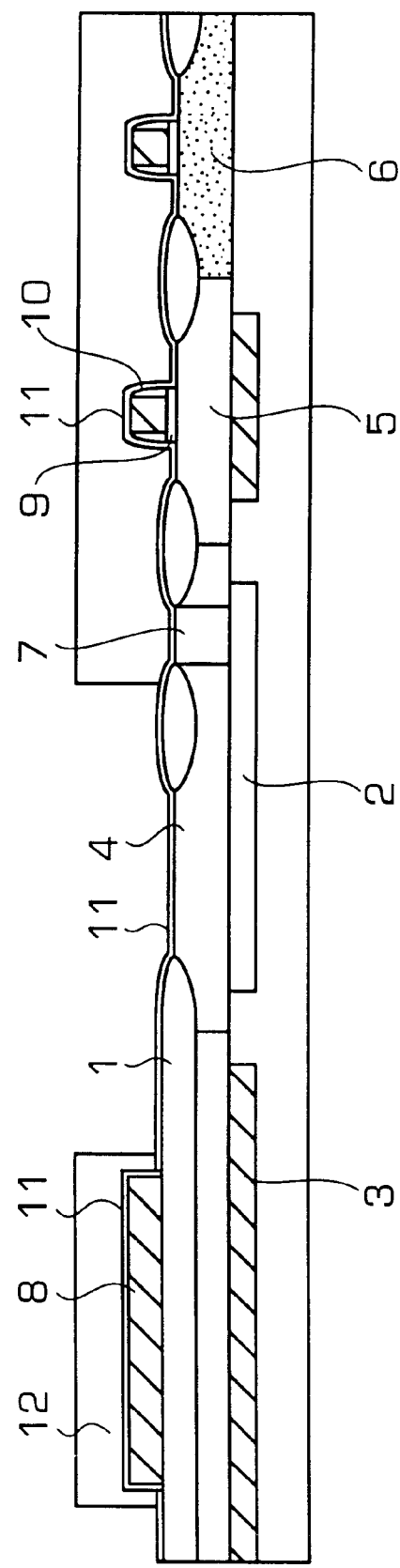

Next, FIG. 5 is referred. After a silicon dioxide film 11 which is to serve as an insulating film between the first electrode and the second electrode is formed over the entire surface to a thickness of 5~20 nm by either thermal oxidation or the CVD method, a resist 12 is formed in such a way that the gate polysilicon in the capacitor formation region, the $n^+$-collector bring-out region 7 and the MOS formation region are covered but the base section in the bipolar formation region is left out as an uncovered window, and thereby the manufacturing steps up to FIG. 5 are accomplished. As described later, this silicon dioxide film 11 serves to prevent source-drain regions of the MOSFETs as well as the collector bring-out region of the bipolar transistor from being etched away, when a second electrode in the capacitor formation region and a base electrode in the bipolar region are formed into shape by etching base polysilicon 13 and a silicon nitride film 14.

Figure 6:
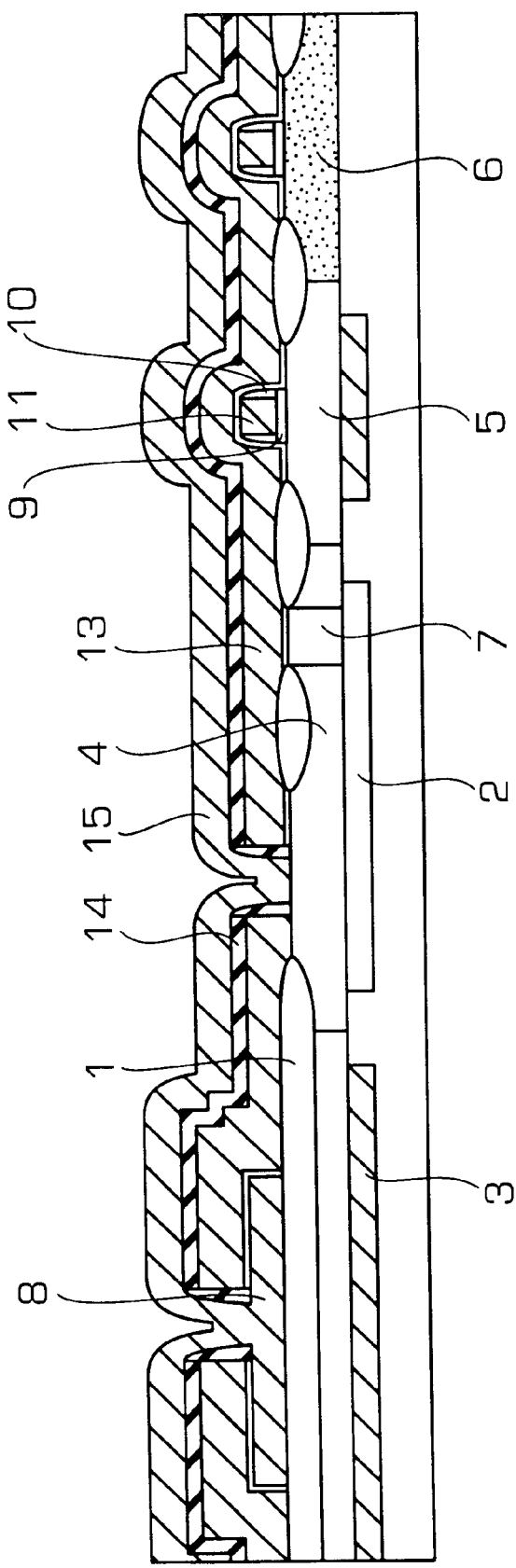

Next, FIG. 6 is referred. Following the manufacturing steps up to FIG. 5, the uncovered part of the silicon dioxide film 11 with this photoresist 12 is removed by etching.

Next, base polysilicon 13 is formed on the entire surface to a thickness of 100~500 nm by the CVD method. To this base polysilicon, boron or $BF_2$ is injected by means of ion implantation under the condition with an accelerating energy of 20~50 keV and a dose of $1\sim5\times10^{15}$ $cm^{-2}$. Subsequently, a silicon nitride film 14 which is to serve as an insulating film between the second electrode and the third electrode is formed on the entire surface. After that, the silicon nitride film 14 and the base polysilicon 13 are etched, using a resist. This etching leads to form an opening in a position prescribed for the emitter electrode formation in the bipolar formation region and, at the same time, to form a through hole in the base polysilicon in the capacitor formation region to expose the gate polysilicon to the surface.

Then, to the epitaxial layer 4 in the bipolar formation region, phosphorus is first injected, by means of the ion implantation, under the condition that an accelerating energy is 50~100 keV and a dose is $1\sim5\times10^{15}$ $cm^{-2}$ for the formation of a collector, and, in succession, $BF_2$ is injected under the condition that an accelerating energy is 10~40 keV and a dose is $1\sim5\times10^{13}$ $cm^{-2}$ for the formation of a base. Further, in order to form a selective ion implantation collector (SIC), phosphorus is selectively injected to a section deep down from the surface, by means of the ion implantation, under the condition with an accelerating energy of 200~400 keV and a dose of $1\sim5\times10^{12}$ $cm^{-2}$.

Next, after the insulating film of a silicon nitride film or the like is formed over the entire surface, the etching-back is performed to form sidewalls on the sides of the patterned base polysilicon film. These sidewalls serve as the insulating film between the second electrode and the third electrode as well.

Next, emitter polysilicon 15 is formed over the entire surface to a thickness of 100~500 nm by the CVD method. At this, the emitter polysilicon may be grown, from the beginning, in a doped state with $1\times10^{18}\sim1\times10^{21}$ $cm^{-3}$ of impurity such as phosphorus, arsenic or the like, or alternatively, it may be grown undoped and then doped by the ion implantation with an impurity to this dose. An emitter is formed subsequently, by performing the heat treatment at an appropriate time, in a shallow section of the epitaxial layer 4 in the bipolar region. Further, as shown in FIG. 6, the gate polysilicon and the emitter polysilicon in the capacitor formation region are joined together by means of a through hole in the base polysilicon.

Figure 7:
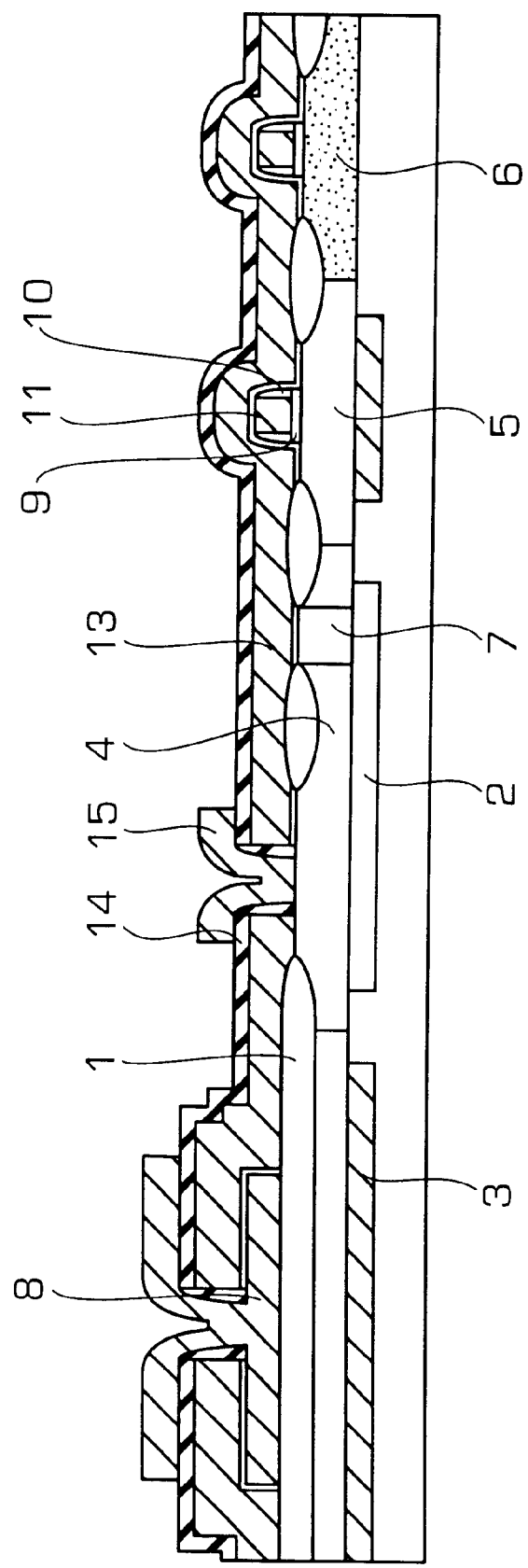

Next, as shown in FIG. 7, the emitter polysilicon 15 is etched and then patterned, and thereby a third electrode in the capacitor formation region and an emitter in the bipolar formation region are worked into prescribed shapes.

Figure 8:
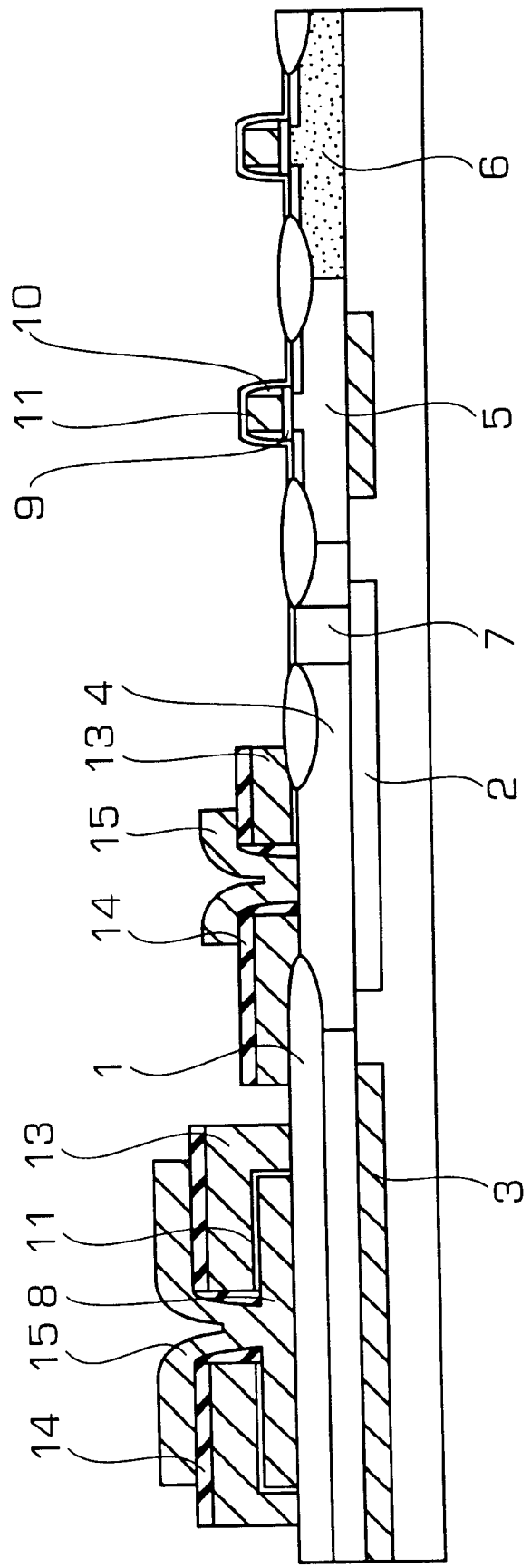

Next, as shown in FIG. 8, the base polysilicon 13 and the silicon nitride film 14 are etched to form into shapes of a second electrode in the capacitor region and a base electrode in the bipolar region. Further, in order to form a source-drain in the n-MOS formation region, arsenic is injected under the condition of an accelerating energy of 20~60 keV and a dose of $1\sim5\times10^{15}$ $cm^{-2}$. As for a source-drain in a p-MOS region, $BF_2$ is injected under the condition of an accelerating energy of 20~60 keV and a dose of $1\sim5\times10^{15}$ $cm^{-2}$, which accomplishes the manufacturing steps up to FIG. 8.

Figure 9:
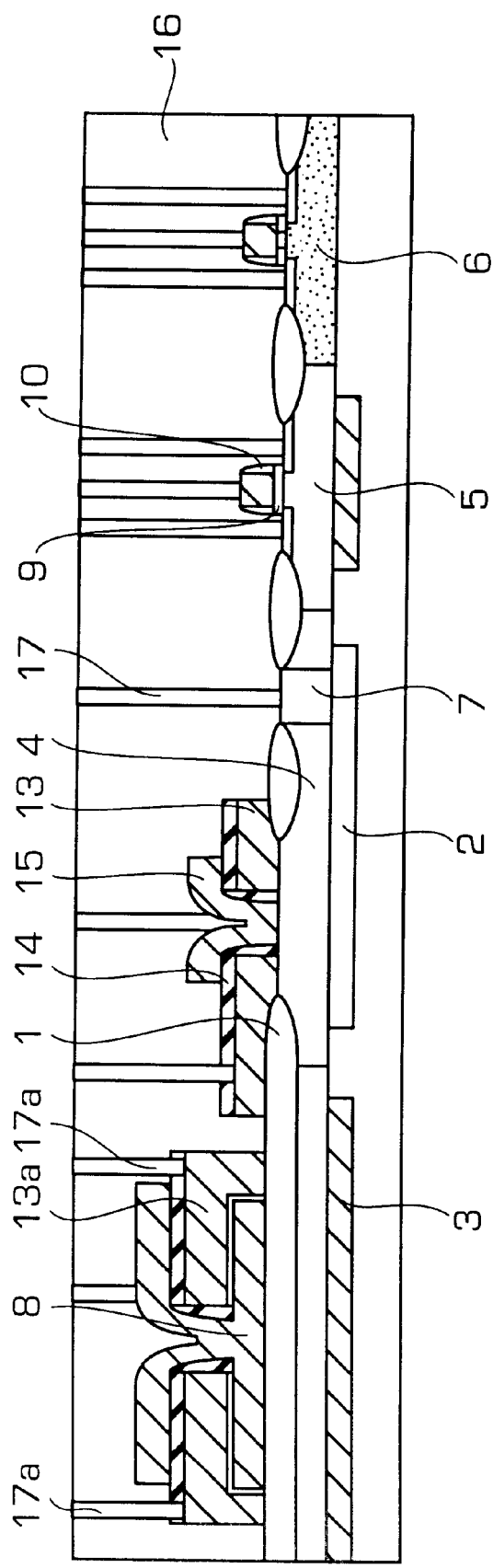

After this, as shown in FIG. 9, a first interlayer insulating film 16 is formed over the entire surface, and holes are made at required positions and filled up with polysilicon, and thereby first layer contacts 17 are formed. The first layer contact 17a formed in the capacitor formation region touches the base polysilicon 13a which is to serve as the second electrode of the capacitor. At this, it is particularly preferable that the first layer contact 17a is formed as a ring, as shown in FIG. 1, so as to touch round the circumference of the second electrode made of the base polysilicon 13a, since this arrangement can reduce a resistance value of the base polysilicon.

Figure 10:
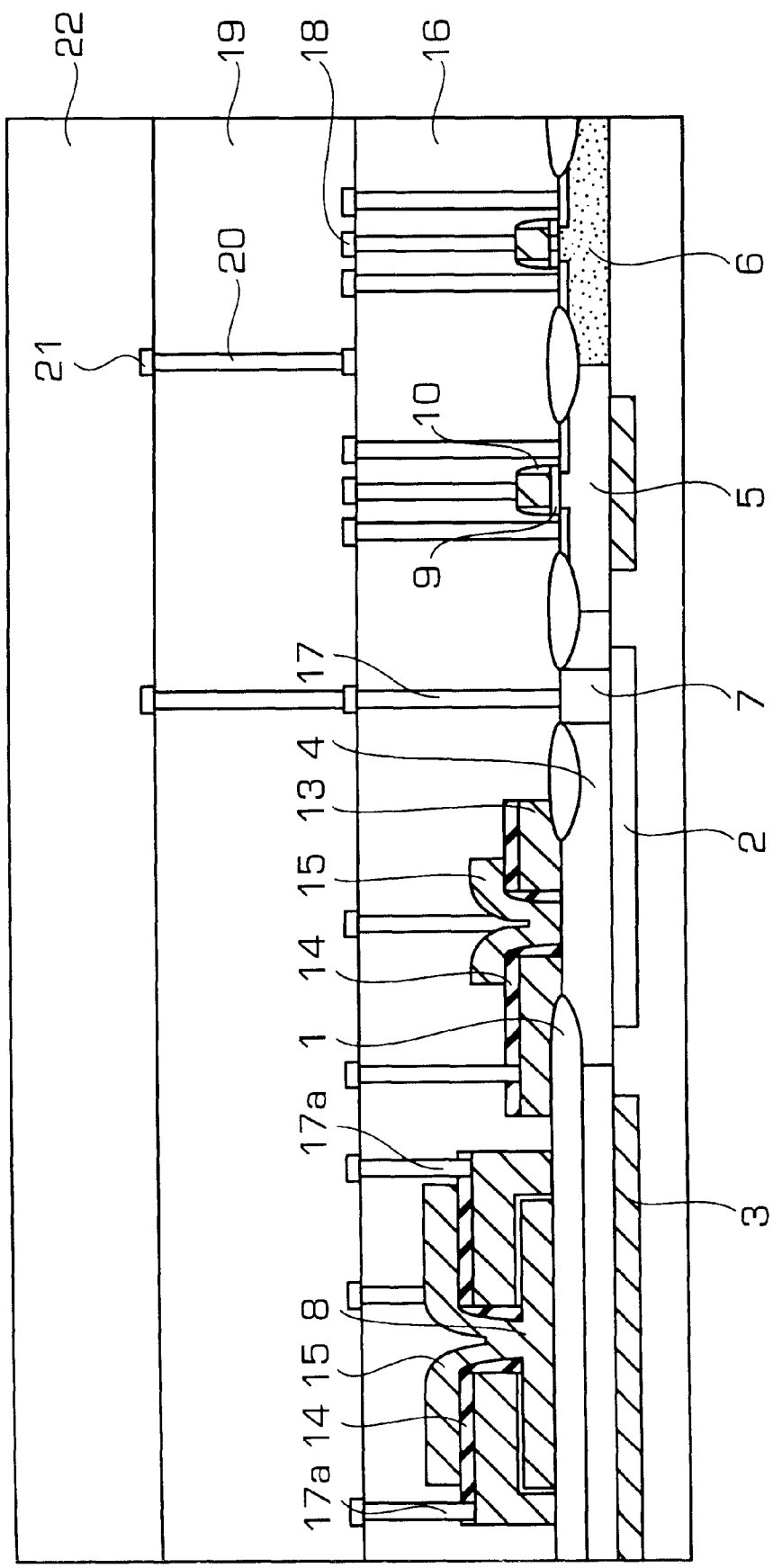

Next, as shown in FIG. 10, a first layer wiring 18 is formed with aluminium or the like on the surface of the first interlayer insulating film 16. Subsequently, in a similar fashion, a second interlayer film 19 is formed and second layer contacts 20 are formed. On the surface thereof, a second layer wiring 21 is formed and, finally, a cover film 22 is formed, and hereby the formation of a Bi-CMOS is accomplished.

Second Embodiment

Referring to the drawings, the second manufacturing method according to the present invention is described in detail.

Figure 11:
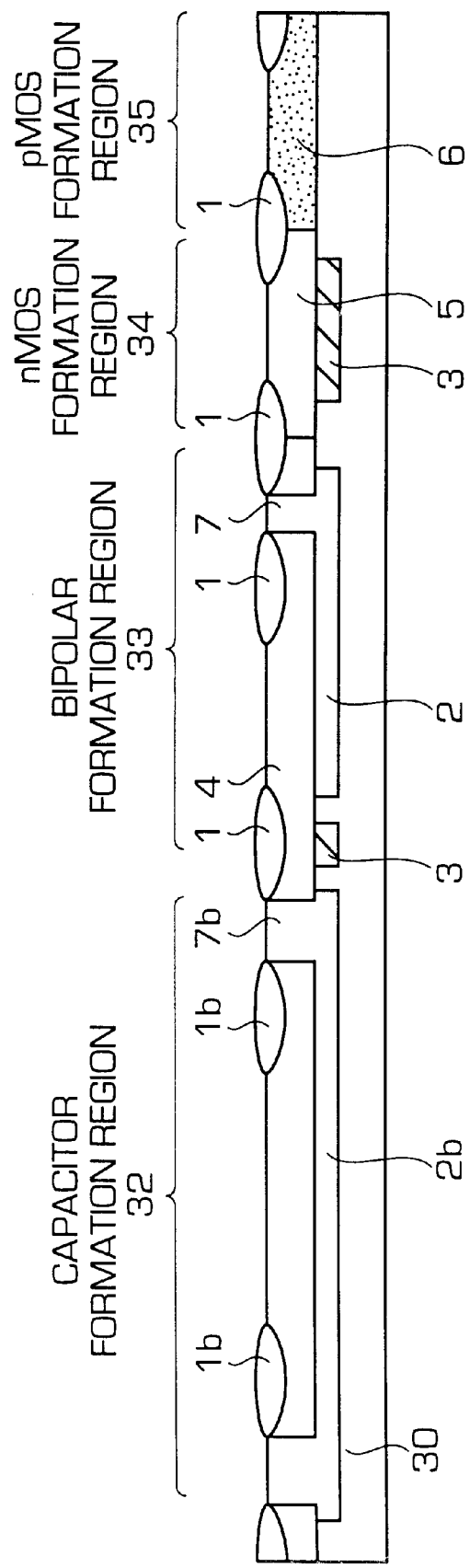

First, as the first embodiment, an $n^+$-buried layer 2 and a $p^+$-buried layer 3 are formed in respective prescribed regions of a silicon substrate 30. After an epitaxial layer 4 is grown on the surface, LOCOS oxide films 1 (field oxide films) are formed, and thereafter an n-well 6 and a p-well 5 are formed by the ion implantation. In addition, in this embodiment, an $n^+$-buried layer 2b is set beneath a capacitor formation region 32, as shown in FIG. 11. This $n^+$-buried layer 2b serves as a fourth electrode of the capacitor. With regard to the LOCOS oxide film 1 in the capacitor formation region 32, it may be set, as shown with the symbol 1b in FIG. 11, leaving out the central section as a window. Or alternatively in the capacitor formation region LOCOS oxide film designated by numeral 1b may not be formed at all.

Next, in order to bring out the contact of the $n^+$-buried layer 2, an $n^+$-collector bring-out region 7 is formed under similar conditions to those in the first embodiment. At this, in order to bring out the contact of the $n^+$-buried layer 2b in the capacitor formation region 32, an n+-collector bring-out region 7b is also set. Seen from above, the n+-collector bring-out region 7b is preferably formed as a ring, as shown in FIG. 2. In this way, manufacturing steps to form the structure as shown in FIG. 11 are accomplished.

Figure 12:
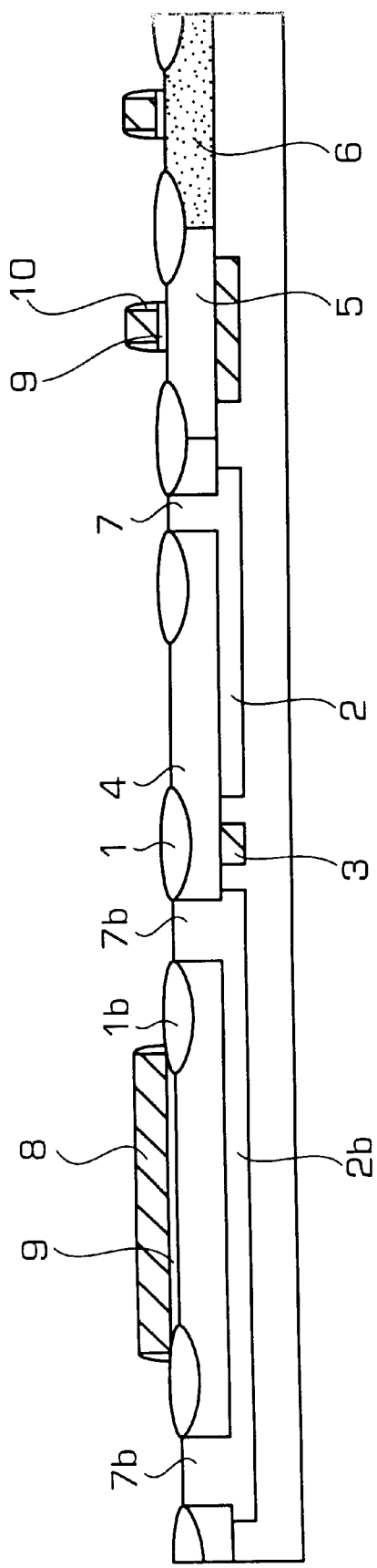
Figure 13:
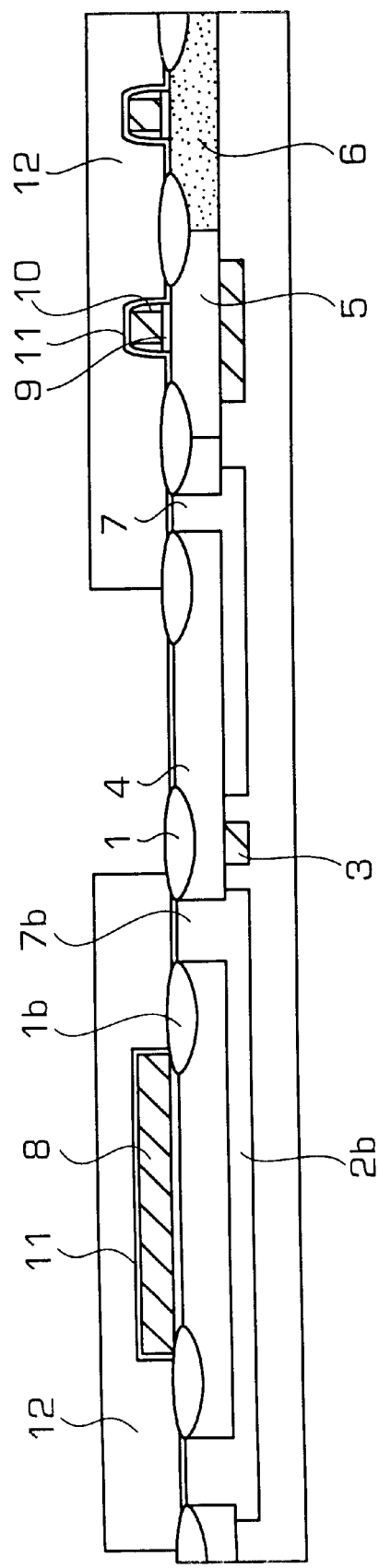

Next, in the completely same way as the first embodiment, gate oxide films 9, gate polysilicon 8 and sidewall oxide films 10 are formed (manufacturing steps up to FIG. 12). After a silicon dioxide film 11 is formed over the entire surface, a resist 12 is formed, leaving a window over the base section in the bipolar formation region uncovered (manufacturing steps up to FIG. 13).

Figure 14:
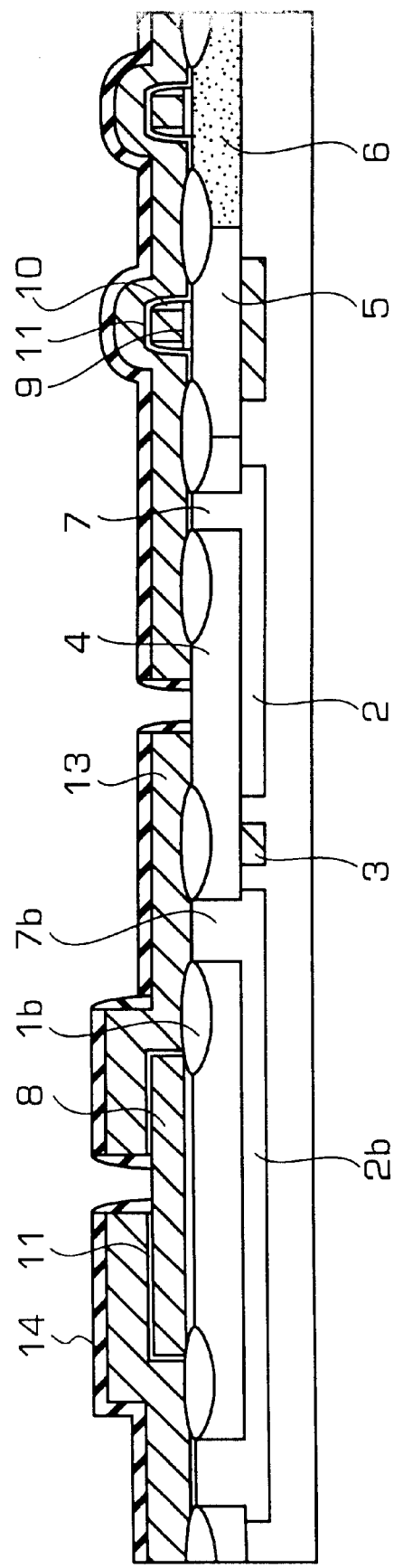

Afterwards, in the same way as the first embodiment, the silicon dioxide film 11 is etched, and thereafter the deposition of base polysilicon 13, the doping by the ion implantation, the deposition of a silicon nitride film 14, the formation of a through hole by etching the base polysilicon 13 and the silicon nitride film 14, the prescribed ion implantation and the formation of sidewalls on sides of the through hole are carried out, in succession, to accomplish manufacturing steps up to FIG. 14.

Figure 15:
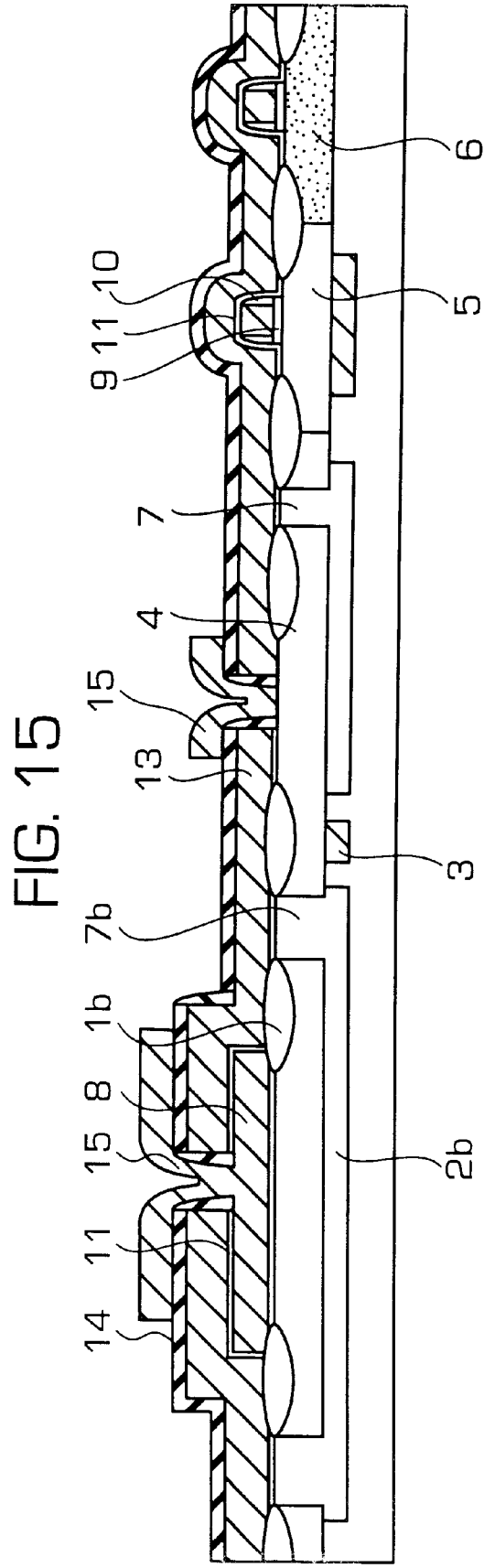

Following this, in the same way as the first embodiment, emitter polysilicon 15 is formed into shape of a capacitor with the silicon nitride film 14 being inserted in the capacitor formation region, and into shape of an emitter in the bipolar formation region, and thereby manufacturing steps up to FIG. 15 are accomplished.

Figure 16:
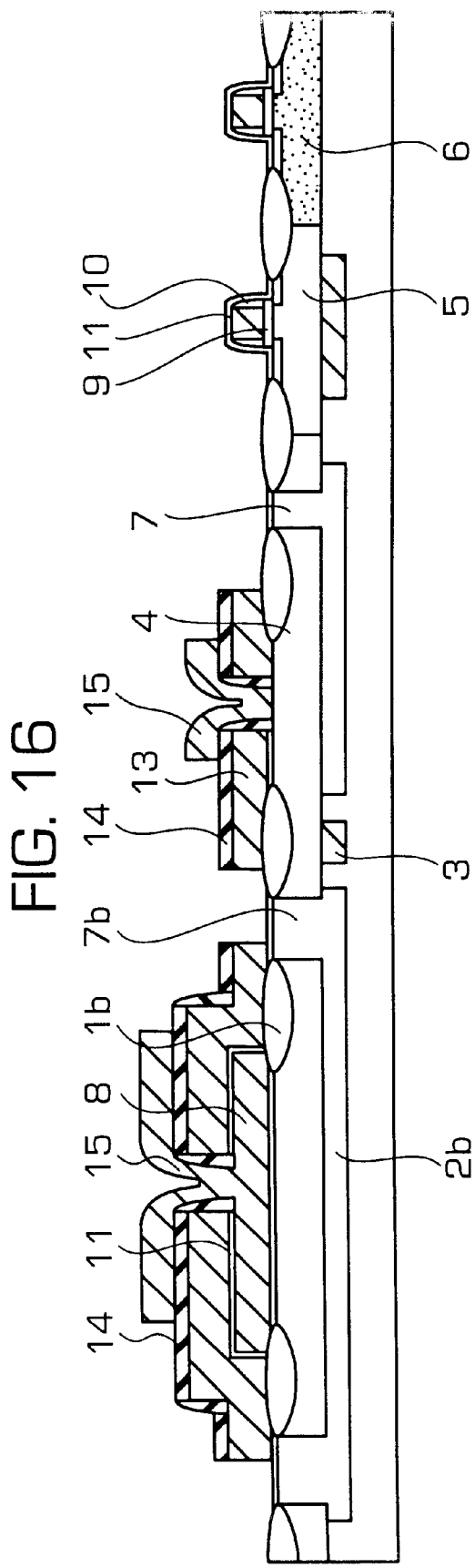

Next, the base polysilicon 13 and the silicon nitride film 14 are etched so as to be left only in the capacitor formation region and the bipolar formation region, which accomplishes the manufacturing steps up to FIG. 16.

Figure 17:
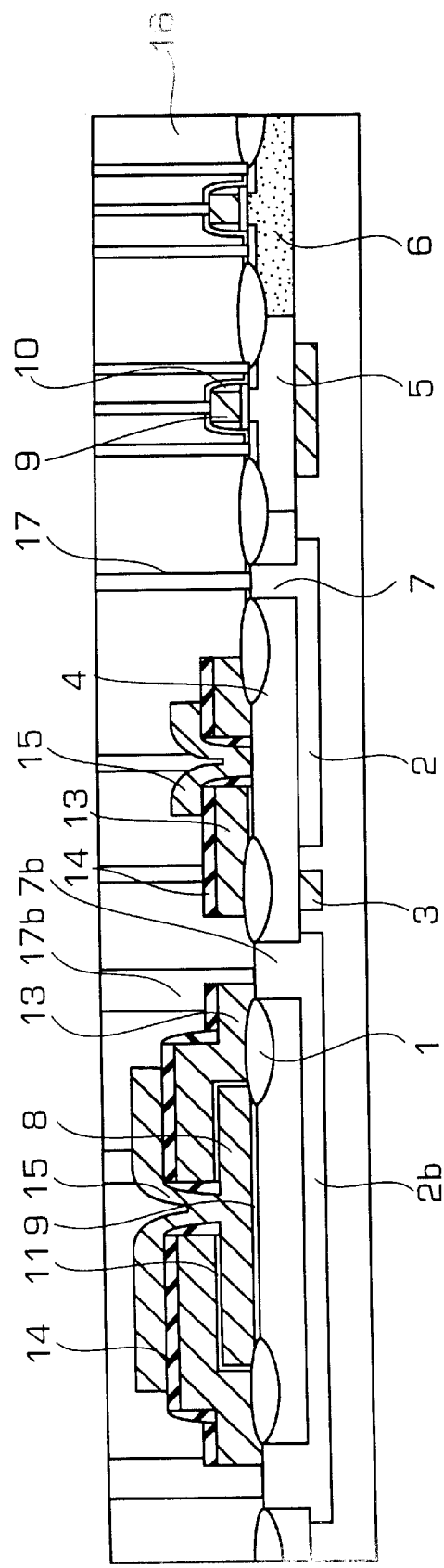

Next, a first interlayer insulating film 16 is formed over the entire surface and then first layer contacts 17 are formed. At this, the first layer contact 17b in the capacitor formation region is formed, as shown in FIG. 17, so as to touch both the collector bring-out region 7b and the base polysilicon 13. In doing this, a portion of the silicon nitride film 14 lying over a part of the base polysilicon 13 that is to connect with the contact 17b is removed beforehand, at the same time that the silicon dioxide film which is normally used as a first insulating film 16 is etched.

It is particularly preferable that, seen from above, the contact 17b is set in the shape of a ring, touching round the collector bring-out region 7b and the base polysilicon i3, as shown in FIG. 2.

Figure 18:
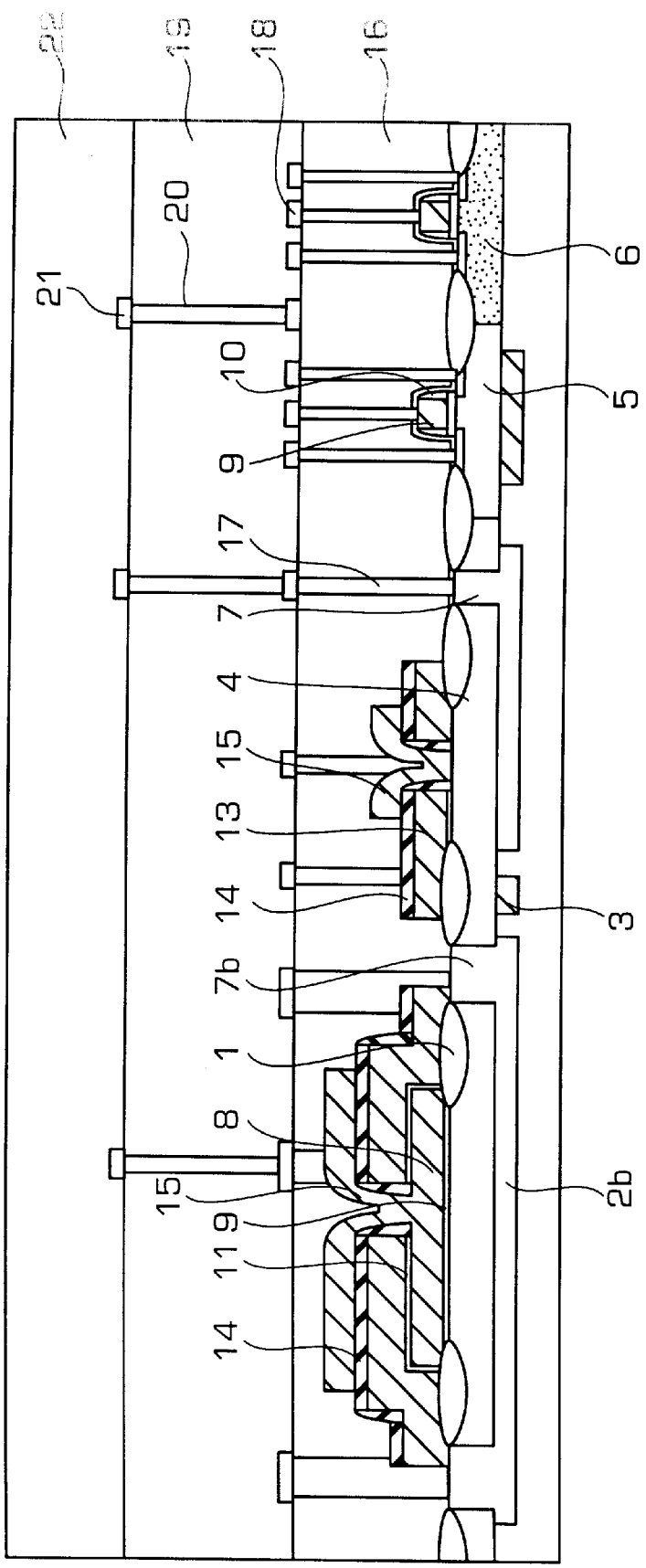

Subsequently, in the same way as the first embodiment, a first layer wiring 18, a second interlayer insulating film 19, second layer contacts 20 and a second layer wiring 21 are formed in succession and, finally, a cover film 22 is formed. Thus, the formation of a Bi-CMOS as shown in FIG. 18 is accomplished.

In the first and the second embodiments described above, the first electrode of the capacitor and the gate electrodes of the MOSFETs are formed of polysilicon. However, the use of polycide that is silicided polysilicon with titanium, cobalt, molybdenum, tungsten or the like, is preferable, since it reduces the resistance value of the capacitor further down.

The first manufacturing method according to the present invention can provide a capacitor having a large and precise capacitance and occupying only a small area. This manufacturing method requires no extra steps, since all electrodes in the capacitor and insulating films between them are formed using the same materials as those for MOSFETs or a bipolar transistor and worked into shape simultaneously. Therefore, a semiconductor device such as a Bi-CMOS and the like, which is capable of large scale integration can be produced with a high efficiency and a low cost.

The second manufacturing method according to the present invention can provide a capacitor having a still larger capacitance and occupying only a small area. This manufacturing method also requires no extra steps, since all electrodes in the capacitor and insulating films between them are formed using the same materials as those for MOSFETs or a bipolar transistor and worked into shape simultaneously. Therefore, a semiconductor device such as a Bi-CMOS and the like, which is capable of large scale integration can be produced with a high efficiency and a low cost.

Further, a semiconductor device according to the present invention has such a capacitor structure with a small occupying area, a large capacitance and a low resistance that it is marked by a rapid response as well as excellent high-frequency characteristics.

What is claimed is:

1. A semiconductor device having, upon a semiconductor substrate, a capacitor comprising a first electrode, a second electrode separated from the first electrode by an insulating film, a third electrode separated from the second electrode by an insulating film and connected to the first electrode; wherein the first electrode and third electrode are joined together by means of a through hole opened around the center of the second electrode and an electric contact, being formed as a ring within an interlayer insulating film overlying the capacitor, touches round the circumference of the second electrode.

2. The semiconductor device according to claim 1, wherein the first electrode, second electrode and third electrode are formed of polysilicon.

3. A semiconductor device having, upon a semiconductor substrate, a capacitor constituted from a first electrode, a second electrode separated from the first electrode by an insulating film, a third electrode separated from the second electrode by an insulating film and connected to the first electrode and a fourth electrode formed in the semiconductor substrate, along the first electrode over an insulating film and connected to the second electrode; wherein the first electrode and third electrode are joined together by means of a through hole opened around the center of the second electrode; and a bring-out section of the fourth electrode to the surface of the substrate is formed as a ring;

an electric contact is formed as a ring within an interlayer insulating film overlying the capacitor; and the circumference of the second electrode, a ring of the bring-out section of the fourth electrode to the substrate surface and the ring of the electric contact touch round with one another.

4. The semiconductor device according to claim 3, wherein the first electrode, second electrode and third electrode are formed of polysilicon and the fourth electrode is formed as a buried layer within a semiconductor substrate.

5. The semiconductor device according to claim 1, wherein the first electrode is formed of polycide, while the second and third electrodes are formed of polysilicon.

6. The semiconductor device according to claim 3, wherein the first electrode is formed of polycide, while the second and third electrodes are formed of polysilicon, and the fourth electrode is formed as a buried layer within a semiconductor substrate.

* * * * *

UNITED STATES PATENT AND TRADEMARK OFFICE
CERTIFICATE OF CORRECTION

PATENT NO. : 6,307,227 B1
DATED : October 23, 2001
INVENTOR(S) : Hiroki Fujii

It is certified that error appears in the above-identified patent and that said Letters Patent is hereby corrected as shown below:

Column 6,
Line 50, delete "p+" insert -- $p^+$ --

Column 9,
Line 43, delete "i3" insert -- 13 --

Signed and Sealed this

Second Day of April, 2002

Attest:

JAMES E. ROGAN
Attesting Officer  Director of the United States Patent and Trademark Office